(12) United States Patent
Hashimoto

(10) Patent No.: US 6,508,879 B1
(45) Date of Patent: Jan. 21, 2003

(54) METHOD OF FABRICATING GROUP III-V NITRIDE COMPOUND SEMICONDUCTOR AND METHOD OF FABRICATING SEMICONDUCTOR DEVICE

(75) Inventor: Shigeki Hashimoto, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/711,260

(22) Filed: Nov. 10, 2000

(30) Foreign Application Priority Data

Nov. 12, 1999 (JP) ............................................. 11-323303

(51) Int. Cl.$^7$ ............................................... C30B 75/16
(52) U.S. Cl. ........................ 117/104; 117/101; 117/952
(58) Field of Search ................................. 117/952, 101, 117/104

(56) References Cited

U.S. PATENT DOCUMENTS

| | | | | |
|---|---|---|---|---|
| 5,602,418 A | * | 2/1997 | Imai et al. .................... | 257/627 |
| 6,043,140 A | * | 3/2000 | Kawai et al. ................ | 438/503 |
| 6,051,847 A | * | 4/2000 | Oku et al. .................... | 257/94 |
| 6,172,382 B1 | * | 1/2001 | Nagahama et al. ............ | 257/94 |
| 6,307,219 B1 | * | 10/2001 | Oku et al. .................... | 257/101 |

* cited by examiner

*Primary Examiner*—Robert Kunemund
(74) *Attorney, Agent, or Firm*—Rader, Fishman & Grauer PLLC; Ronald P. Kananen, Esq.

(57) ABSTRACT

A method of fabricating a group III-V nitride compound semiconductor in which high crystallinity is achieved without lack of nitrogen, even when it is grown at a low temperature, and a method of fabricating a semiconductor device employing the method of fabricating a group III-V nitride compound semiconductor are provided. Along with carrier gas, a gas source including a nitrogen-including compound such as hydrazine, a substitution product of hydrazine, amine or azide as a nitrogen source is supplied to a reaction tube of a MOCVD apparatus. These nitrogen-including compounds have higher decomposition efficiencies than those of ammonia. Therefore, even though MOCVD is performed at a growth temperature below or equal to 900° C., a large amount of nitrogen which contributes growth is supplied onto the growth surface of a substrate (that is, an underlying layer). As a result, crystallinity of the group III-V nitride compound semiconductor layer is improved. Further, the amount of the supplied nitrogen source relative to the amount of the source of the group V element supplied can be made smaller.

7 Claims, 2 Drawing Sheets

METHOD OF FABRICATING GROUP III-V NITRIDE COMPOUND SEMICONDUCTOR AND METHOD OF FABRICATING SEMICONDUCTOR DEVICE

BACKGROUND OF THE INVENTION

1. Field of the Invention

The present invention relates to a method of fabricating a group III-V nitride compound semiconductor in which a group III-V nitride compound semiconductor including nitrogen (N) is grown using a metal organic chemical vapor deposition (MOCVD) method and the method of fabricating a semiconductor device employing the method of fabricating a group III-V nitride compound semiconductor.

2. Description of the Related Art

In recent years, a group III-V nitride compound semiconductor such as gallium nitride (GaN) has come to the fore as a promising material for a semiconductor comprising a light-emitting device capable of emitting in a visible region from green to blue or in a ultraviolet region, a high-frequency electron device, or an environment-resistant electron device. More specifically, the group III-V nitride compound semiconductor has received great attention when the light-emitting diode (LED) employing the group III-V nitride compound semiconductor came into practical use. Further, practical realization of a semiconductor laser (LD) using the group III-V nitride compound semiconductor has been reported. Therefore, the desire for application of the group III-V nitride compound semiconductor, including a optical disk device as a light source, has arisen.

Such a group III-V nitride compound semiconductor is generally fabricated by growing it on a substrate made of sapphire or a substrate made of silicon nitride (SiC). Examples of methods for growing the group III-V nitride compound semiconductor are the MOCVD method or a molecular beam epitaxy (MBE) method. Among these methods, the MOCVD method is practically effective because it does not require a high vacuum state. Thus, the MOCVD is frequently used.

Conventionally, when the group III-V nitride compound semiconductor is grown using the MOCVD method, along with ammonia ($NH_3$) as a nitrogen source, an organic metal source gas as a source for gallium (Ga), aluminum (Al), indium (In), boron (B) and the like corresponding to the group III-V nitride compound semiconductor to be grown is supplied into a reaction tube of a MOCVD apparatus to grow the group III-V nitride compound semiconductor on the growth surface of a substrate set in the reaction tube.

When the group III-V nitride compound semiconductor not including indium such as GaN or AlGaN mixed crystal is grown using this MOCVD method, the growth temperature is about 1000° C. in general. In the case where the group III-V nitride compound semiconductor including indium such as GaInN mixed crystal is grown with the MOCVD method, the growth temperature is generally about 700 to 800° C., since in order to suppress decomposition of InN, the growth temperature has to be lower than the growth temperature when the group III-V nitride compound semiconductor constituted with GaN is grown.

However, since ammonia used as a nitrogen source has low decomposition efficiency, only a couple of percent of ammonia is decomposed at a temperature as high as about 1000° C. Therefore, nitrogen contributing growth that is supplied onto the growth surface of the substrate during growth is insufficient. As a result, the group III-V nitride compound semiconductor has insufficient nitrogen, which lowers the crystallinity. Specifically, with a GaN light-emitting device which emits a blue-purple light, an active layer (emitting layer) is composed of the group III-V nitride compound semiconductor including indium as a group III element and is grown at a low temperature. Thus, crystallinity of the active layer lowers, resulting in low emission efficiency.

SUMMARY OF THE INVENTION

The present invention has been achieved in view of the above problems. It is an object of the invention to provide a method of fabricating a group III-V nitride compound semiconductor in which high crystallinity is achieved without lack of nitrogen, even when it is grown at a low temperature, and a method of fabricating a semiconductor device employing the method of fabricating a group III-V nitride compound semiconductor.

According to the first method of fabricating a group III-V nitride compound semiconductor of the present invention, a group III-V nitride compound semiconductor including at least one selected from group III-V elements and at least nitrogen (N) selected from group V elements is grown using a metal organic chemical vapor deposition method. With this method, the growth temperature is below or equal to 900° C., and a nitrogen-including compound having at least one of a single bond of nitrogen atoms, a double bond of nitrogen atoms and a single bond of a nitrogen atom and a carbon atom is used as a nitrogen source.

According to the second method of fabricating a group III-V nitride compound semiconductor of the present invention, a group III-V nitride compound semiconductor including at least one selected from group III elements and at least nitrogen (N) selected from group V elements is grown using a metal organic chemical vapor deposition method. With this method, the growth temperature is below or equal to 900° C., and ammonia and a nitrogen-including compound having at least one of a single bond of nitrogen atoms, a double bond of nitrogen atoms and a single bond of a nitrogen atom and a carbon atom is used as a nitrogen source.

According to the third method of fabricating a group III-V nitride compound semiconductor of the present invention, a group III-V nitride compound semiconductor including at least indium (In) selected from group III elements and at least nitrogen (N) selected from group V elements is grown using a metal organic chemical vapor deposition method. With this method, a nitrogen-including compound having at least one of a single bond of nitrogen atoms, a double bond of nitrogen atoms and a single bond of a nitrogen atom and a carbon atom is used as a nitrogen source.

According to the fourth method of fabricating a group III-V nitride compound semiconductor of the present invention, a group III-V nitride compound semiconductor including at least indium (In) selected from group III elements and at least nitrogen (N) selected from group V elements is grown using a metal organic chemical vapor deposition method. With this method, ammonia and a nitrogen-including compound having at least one of a single bond of nitrogen atoms, a double bond of nitrogen atoms and a single bond of a nitrogen atom and a carbon atom is used as a nitrogen source.

According to the first method of fabricating a semiconductor device of the present invention, a group III-V nitride compound semiconductor layer including at least one of group III elements and at least nitrogen (N) selected from group V elements is provided. With this method, the group III-V nitride compound semiconductor layer is grown at a growth temperature below or equal to 900° C. with a metal organic chemical vapor deposition method using a nitrogen including compound having at least one of a single bond of nitrogen atoms, a double bond of nitrogen atoms and a single bond of a nitrogen atom and a carbon atom as a nitrogen source.

According to the second method of fabricating a semiconductor device of the present invention, a group III-V nitride compound semiconductor layer including at least one selected from group III elements and at least nitrogen (N) selected from group V elements is provided. With this method, the group III-V nitride compound semiconductor layer is grown at a growth temperature below or equal to 900° C. with a metal organic chemical vapor deposition method using ammonia and a nitrogen including compound having at least one of a single bond of nitrogen atoms, a double bond of nitrogen atoms and a single bond of a nitrogen atom and a carbon atom as a nitrogen source.

According to the third method of fabricating a semiconductor device of the present invention, a group III-V nitride compound semiconductor layer including at least indium (In) selected from group m elements and at least nitrogen (N) selected from group V elements is provided. With this method, the group III-V nitride compound semiconductor layer is grown with a metal organic chemical vapor deposition method using a nitrogen-including compound having at least one of a single bond of nitrogen atoms, a double bond of nitrogen atoms and a single bond of a nitrogen atom and a carbon atom as a nitrogen source.

According to the fourth method of fabricating a semiconductor device of the present invention, a group III-V nitride compound semiconductor layer including at least indium (In) selected from group III elements and at least nitrogen (N) selected from group V elements is provided. With this method, the group III-V nitride compound semiconductor layer is grown with a metal organic chemical vapor deposition method using ammonia and a nitrogen including compound having at least one of a single bond of nitrogen atoms, a double bond of nitrogen atoms and a single bond of a nitrogen atom and a carbon atom as a nitrogen source.

With the first method of fabricating a group III-V nitride compound semiconductor and the first method of fabricating a semiconductor device of the present invention, the group III-V nitride compound semiconductor is grown at a growth temperature below or equal to 900° C. with a metal organic chemical vapor deposition method using a nitrogen-including compound having at least one of a single bond of nitrogen atoms, a double bond of nitrogen atoms and a single bond of a nitrogen atom and a carbon atom as a nitrogen source.

With the second method of fabricating a group III-V nitride compound semiconductor and the second method of fabricating a semiconductor device of the present invention, a group III-V nitride compound semiconductor is grown at a growth temperature below or equal to 900° C. with a metal organic chemical vapor deposition method using ammonia and a nitrogen-including compound having at least one of a single bond of nitrogen atoms, a double bond of nitrogen atoms and a single bond of a nitrogen atom and a carbon atom as a nitrogen source.

With the third method of fabricating a group III-V nitride compound semiconductor and the third method of fabricating a semiconductor device of the present invention, a group III-V nitride compound semiconductor including indium is grown with a metal organic chemical vapor deposition method using a nitrogen-including compound having at least one of a single bond of nitrogen atoms, a double bond of nitrogen atoms and a single bond of a nitrogen atom and a carbon atom as a nitrogen source.

With the fourth method of fabricating a group III-V nitride compound semiconductor and the fourth method of fabricating a semiconductor device of the present invention, a group III-V nitride compound semiconductor including indium is grown with a metal organic chemical vapor deposition method using ammonia and a nitrogen-including compound having at least one of a single bond of nitrogen atoms, a double bond of nitrogen atoms and a single bond of a nitrogen atom and a carbon atom as a nitrogen source.

Other and further objects, features and advantages of the invention will appear more fully from the following description.

DETAILED DESCRIPTION OF THE PREFERRED EMBODIMENTS

Embodiments of the present invention will be described in detail below with reference to the following drawings.

First Embodiment

The method of fabricating a group III-V nitride compound semiconductor according to the first embodiment of the present invention is a method for growing a group III-V nitride compound semiconductor including at least one selected from the group III elements consisting of gallium, aluminum, indium and boron and at least nitrogen selected from the group V elements consisting of nitrogen, arsenic (As) and phosphorus (P). Examples of such group III-V nitride compound semiconductors are InN, GaInN mixed crystal, AlGaInN mixed crystal, GaN, AlN and AlGaN compound crystal. This group III-V nitride compound semiconductor may include n-type impurities such as silicon (Si) or p-type impurities such as magnesium (Mg), as necessary.

Figure 1:
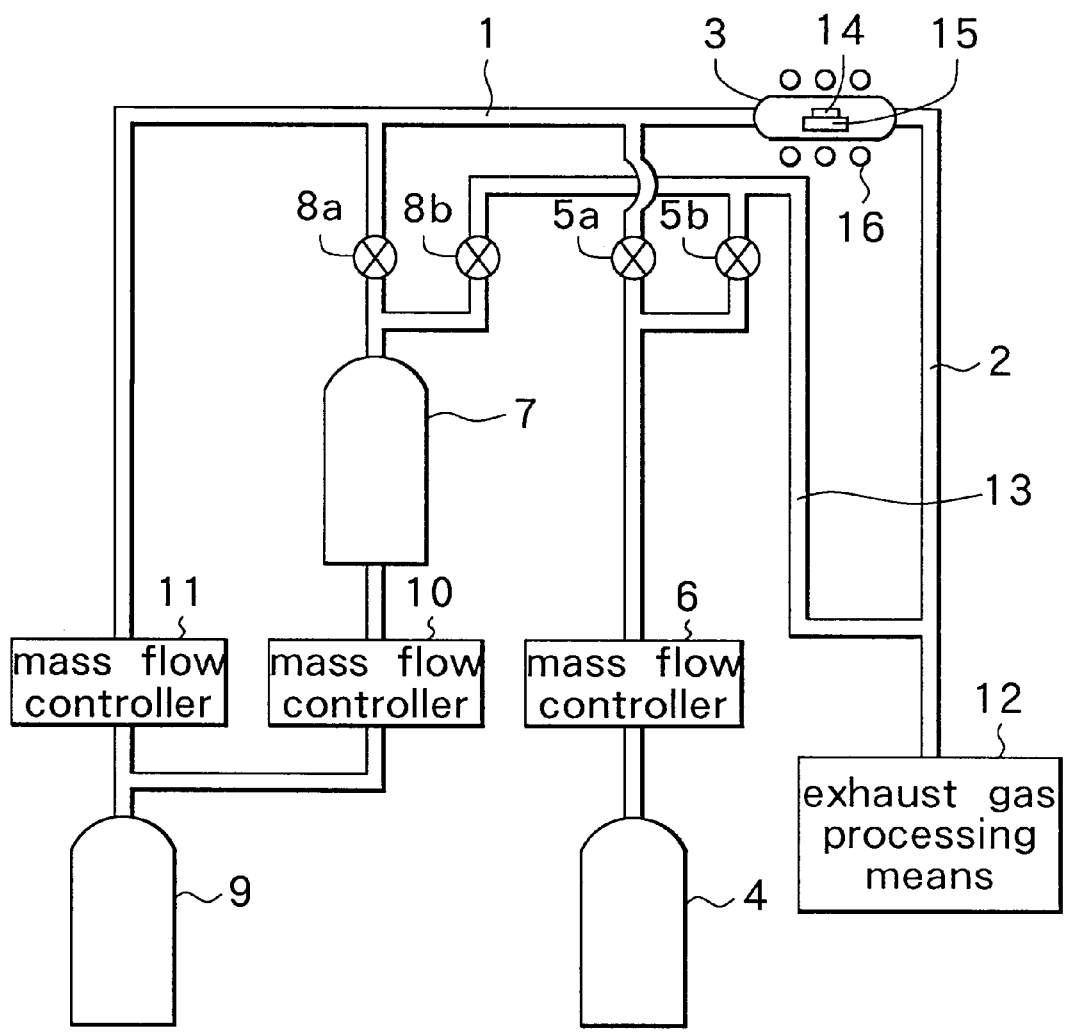
FIG. 1 is a schematic view of the structure of a MOCVD apparatus used in a method of fabricating a group III-V nitride compound semiconductor according to the first embodiment of the present invention.

FIG. 1 shows a schematic structure of a MOCVD apparatus used for the method of fabricating a group III-V nitride compound semiconductor according to the embodiment. The MOCVD apparatus has a reaction tube 3 to which a gas supply pipe 1 and a gas exhaust pipe 2 are connected. A gas source supply portion 4 for supplying a gas source including group V elements and silicon as n-type impurities is connected to the gas supply pipe 1 via a valve 5a. Supply of the gas source is controlled by a mass-flow controller 6.

An organic metal source gas supply portion 7 for supplying an organic metal source gas including group III elements and magnesium as p-type impurities is connected to the gas supply pipe 1 via a valve 8. A carrier gas supply portion 9 is connected to the organic metal source gas supply portion 7 via the mass flow controller 10, and the amount of organic metal source gas to be supplied is controlled by means of the flow velocity of carrier gas such as hydrogen gas ($H_2$). The carrier gas supply portion 9 is directly connected to the supply pipe 1 via the mass-flow controller 11. That is, along with the carrier gas, the gas source and the organic metal source gas, which are selected as needed, are supplied to the reaction tube 3 as a source gas.

An exhaust gas possessing means 12 is connected to the gas exhaust pipe 2. The exhaust gas processing means 12 is for exhausting the gas source and the organic metal source gas that are no longer needed. Connected to the exhaust gas processing means 12 are a gas let-off tube 13 and via valves 5b and 8b, respectively, the gas source supply portion 4 and the organic metal source gas supply portion 7.

The reaction tube 3 is made of a thermally stable material having a sufficient strength, such as a quartz glass. Provided inside of the reaction tube 3 is a susceptor 15 made of, e.g., graphite, for setting a substrate 14 on which the group III-V nitride compound semiconductor is grown. Radio frequency (RF) coils 16 are disposed enclosing the reaction tube 3. Induction heating is applied on the suscepror 15 by the RF coils 16, resulting in heating the source gas that is supplied to the substrate 14 and inside of the reaction tube 3. In the vicinity of both ends of the reaction tube 3, pressure adjusting means (not shown) are provided, respectively, which maintain a predetermined pressure inside of the reaction tube 3.

Figure 2:
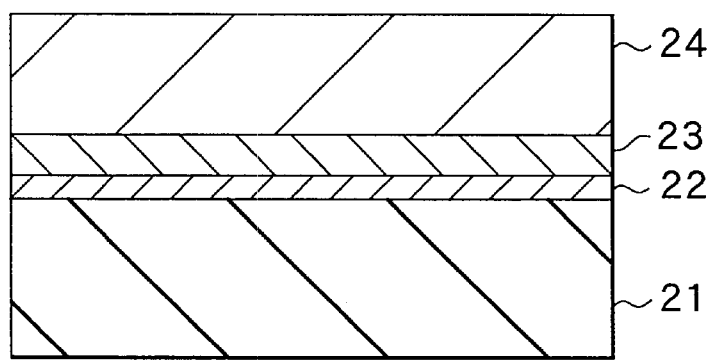
FIG. 2 is a sectional view for describing the method of fabricating a group III-V nitride compound semiconductor according to the first embodiment of the present invention.

With the embodiment, using a MOCVD apparatus, the group III-V nitride compound semiconductor is grown in the following manner. The method of fabricating a group III-V nitride compound semiconductor of the embodiment will be described with reference to FIG. 2 hereinafter.

An organic metal corresponding to the group III element to be grown and a gas corresponding to the group V element are prepared as a source.

With the embodiment, prepared as a nitrogen source is a nitrogen-including compound having at least one of a single bond of nitride atoms in Chemical formula 1, a double bond of nitride atoms in Chemical formula 2 and a single bond of a nitride atom and a carbon atom in Chemical formula 3.

Chemical formula 1

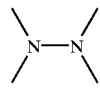

Chemical formula 2

—N=N—

Chemical formula 3

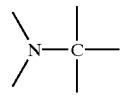

Examples of the nitrogen-including compounds having the single bond of nitrogen atoms or the nitrogen-including compounds having the single bond of a nitrogen atom and a carbon atom are hydrazine or a substitution product of hydrazine and amine. More specifically, monomethylhydrazine ($CH_3$—NH—$NH_2$), 1-dimethylhydrazine in Chemical formula 4, 1,2-dimethylhydrazine in Chemical formula 5, hydrazine ($NH_2$—$NH_2$) or t-butylamine (($CH_3$)$_3$C—$NH_2$) is used. An example of a nitrogen-including compound having the double-bond of nitrogen atoms is azide such as ethylazide ($C_2H_5$—$N_3$). Combination of two or more of these gasses may be used as the nitrogen including compound.

Chemical formula 4

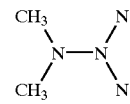

Chemical formula 5

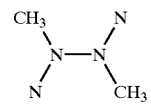

The decomposition efficiency of the aforementioned nitrogen-including compound is higher than that of ammonia For example, when the group III-V compound semiconductor including only nitrogen as the group V element is subject to growth, the following is observed. Using ammonia as a nitrogen source, a mole ratio (a supply ratio) of ammonia to the organic metal as a source of the group V element is ammonia/organic metal=approximately 10,000. On the other hand, using the aforementioned nitrogen including compound as a nitrogen source, the group III-V nitride compound semiconductor can be grown despite the small supplied amount of the nitrogen-including compound, which is a nitrogen including compound/organic metal= approximately 50, at the same growth temperature (the temperature of the substrate 14 inside of the reaction tube 3, that is, the temperature of substrate 21) as the growth temperature using ammonia as a nitrogen source. Specifically, the difference in the amounts supplied becomes larger as the growth temperature decreases. Accordingly, the use of the aforementioned nitrogen-including compound enables nitrogen contributing growth to increase at a low temperature; thereby, a large amount of nitrogen is supplied onto the growth surface of the substrate 21. As a result, the lack of nitrogen in the grown group III-V nitride compound semiconductor is improved and a group III-V nitride compound semiconductor with enhanced crystallinity is obtained.

Ammonia is prepared as a nitrogen source. For Example, trimethylgallium (($CH_3$)$_3$Ga) as a gallium source, trimethylaluminum (($CH_3$)$_3$Al) as an aluminum source, trimethylindium (($CH_3$)$_3$In) as an indium source and triethylboron (($C_2H_5$)$_3$B) as a boron source are used. Further, for example, arside ($AsH_3$) as an arsenic source and phosphine ($PH_3$) as a phosphorous source are used.

When silicon is doped as the n-type impurities, silane ($SiH_4$) is prepared, for example. When magnesium is doped as the p-type impurities, bis=cyclopentadienylmagnesium (($C_5H_5$)$_2$Mg) is prepared, for example.

Next, a substrate 21 made of c-plane sapphire or silicon carbide is prepared and cleaned in a hydrogen gas ($H_2$) atmosphere at a temperature of 1100° C., for example. Subsequently, the cleaned substrate 21 is set on the setting surface of the susceptor 15 in the MOCVD apparatus illustrated in FIG. 1, and the temperature of the substrate 21 is decreased to 500° C., for example. Then, while supplying ammonia and trimethylgallium as a nitrogen source to the reaction tube 3, a buffer layer 22 made of GaN is grown 30 nm, for example. The buffer layer 22 may be grown using the aforementioned nitrogen-including compound as a nitrogen source. After the buffer layer 22 is grown, an underlying layer 23 made of GaN is grown on the buffer layer in the following manner, for example. Ammonia is exclusively supplied inside of the reaction tube 3; the temperature of the substrate 21 is increased to about 950–1100° C. (e.g. 1050° C.) by the RF coils 16; and, while keeping this temperature, trimethylgallium is supplied; thus, the underlying layer 23 is formed.

Subsequently, the temperature of the substrate 21 is decreased to below or equal to 900° C. At this time, in the case where a layer including indium such as GaInN mixed crystal is grown on the underlying layer 23, the temperature is decreased to about 700–800° C. in order to suppress decomposition of InN, for example. In the case where a layer not including indium, such as GaN or AlGaN mixed crystal, is subject to growth, the temperature is decreased to about 750–900° C., for example. In this state, the appropriate organic metal is supplied inside of the reaction tube 3 while dimethylhydrazine is supplied as a nitrogen source, for example. Consequently, the source gas supplied inside of the reaction tube 3 is thermally decomposed inside of the reaction tube 3 and, thus, the group III-V nitride compound semiconductor (a group III-V nitride compound semiconductor 24) is grown on the growth surface of the underlying layer 23. In this case, since the nitrogen source is dimethylhydrazine, the nitrogen source is decomposed effectively even at a low growth temperature below or equal to 900° C.

The flow velocity of the source gas and the carrier gas inside the reaction tube 3 is preferably within a range of 0.4 to 2 m/s. When the flow velocity is below or equal to 2 m/s, the source gas is sufficiently heated by the susceptor 15 or the substrate 21. When the flow velocity is over or equal to 0.4 m/s, the source gas is effectively supplied onto the growth surface, suppressing thermal convection of the source gas. The pressure inside the reaction tube 3 is preferably within a range of $1.013 \% 10^5$ to $2.026 \% 10^5$ Pa (1–2 atm). When the pressure is over or equal to $1.013 \% 10^5$ Pa, more nitrogen is supplied onto the substrate 21 and evaporation of nitrogen from the growing group III-V nitride compound semiconductor is suppressed. When the pressure is below or equal to $2.026 \% 10^5$ Pa, it is practically safe.

As described above, according to the method of fabricating a group III-V nitride compound semiconductor of the embodiment, when growing the group III-V nitride compound semiconductor layer 24, the nitrogen-including compound with higher decomposition efficiency than that of ammonia is used as a nitrogen source instead of ammonia, which has been conventionally used. Thus, even though the growth temperature is low, below or equal to 900° C., a large amount of nitrogen contributing growth is supplied onto the growth surface of the substrate 21 (that is, on the underlying layer 23), thereby improving crystallinity of the group III-V nitride compound semiconductor layer 24. Moreover, the amount of the supplied nitrogen source relative to the amount of the source of the group V element supplied can be made smaller. When the group III-V nitride compound semiconductor including indium is grown, it is necessary to grow it at a low temperature; therefore, the above-described method is particularly effective.

Figure 3:
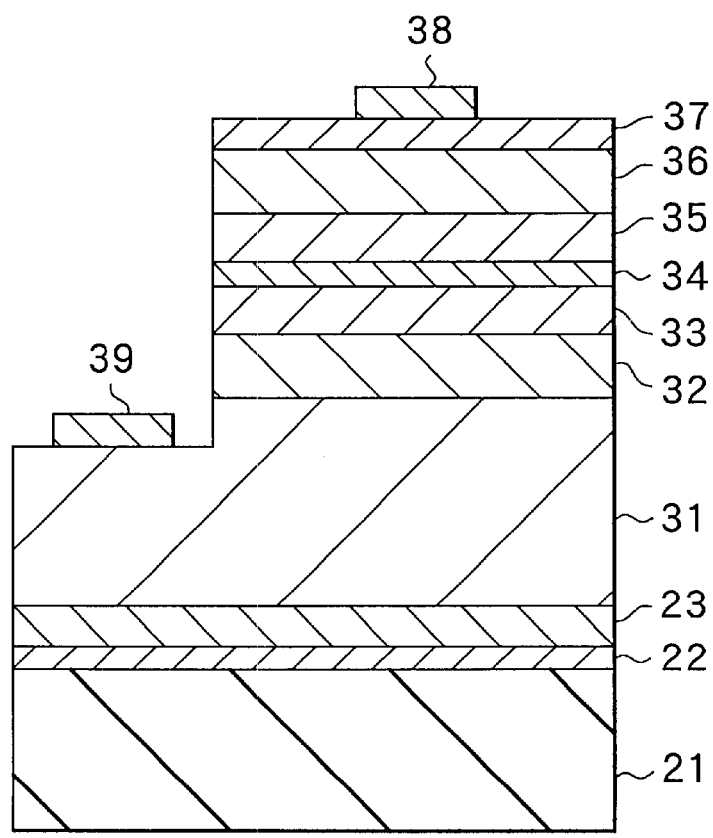
FIG. 3 is a sectional view showing the structure of a semiconductor laser fabricated using a method of fabricating a semiconductor laser comprising a semiconductor device according to the first embodiment of the present invention.

With reference to FIG. 3, a method of fabricating a semiconductor device employing the above-described method of fabricating a group III-V nitride compound semiconductor is described. The detailed description of the same steps as those performed in the method of fabricating a group III-V nitride compound semiconductor is omitted.

FIG. 3 shows the structure of a semiconductor laser comprising a semiconductor device fabricated using the method of fabricating a semiconductor device according to the embodiment. First, prepared in the aforementioned manner are the nitrogen including compound and ammonia as a nitrogen source, the organic metal as a source of the group III element, silane as a silicon source comprising the n-type impurities for doping and the organic metal as a magnesium source comprising the p-type impurities for doping. Thereafter, the substrate 21 made of, for example, c-plane sapphire is prepared and set on the setting surface of the susceptor 15 in the MOCVD apparatus.

Subsequently, the source gas and the carrier gas are selectively supplied inside the reaction tube 3, and the buffer layer 22 made of, for example, GaN is grown on the growth surface of the substrate 21. After that, the underlying layer 23 made of, for example, GaN is grown on the buffer layer 22.

After the growth of the underlying layer 23, each layer comprising the group III-V nitride compound semiconductor layer is grown on the underlying layer 23. That is, while the source gas and the carrier gas are selectively supplied inside the reaction tube 3, a n-side contact layer 31 made of n-type GaN in which silicon is doped, a n-type cladding layer 32 made of n-type AlGaN in which silicon is doped, a n-type guide layer 33 made of n-type GaN in which silicon is doped, an active layer 34 having a multiple quantum well structure of stacked GaInN layers with different composition, a p-type guide layer 35 made of p-type GaN in which magnesium is doped, a p-type cladding layer 36 made of p-type AlGaN in which magnesium is doped and a p-side contact layer 37 made of p-type GaN in which magnesium is doped are grown sequentially.

In this case, for example, when the n-type guide layer 33, the active layer 34 and the p-type guide layer 35 are grown, the growth temperature is below or equal to 900° C., and the aforementioned nitrogen including compound is used as a nitrogen source. Specifically, when the n-type guide layer 33 and the p-type guide layer 35 are grown, the growth temperature is approximately 750 to 900° C. When the active layer 34 is grown, the growth temperature is approximately 700 to 800° C.

The n-side contact layer 31, the n-type cladding layer 32, the p-type cladding layer 36 and the p-side contact layer 37 are grown at a growth temperature higher than 900° C. using ammonia as a nitrogen source, for example. These layers may be grown at a growth temperature lower than 900° C. using the nitrogen-including compound as a nitrogen source, similar to the active layer 34 and the like.

After growing layers from the n-side contact layer 31 to the p-side contact layer 37, heat treatment is performed thereon in order to activate the p-type impurities that have been doped in the p-type guide layer 35, the p-type cladding layer 36, and p-side contact layer 37. After this heat treatment, a stripe-shaped resist pattern is formed in the corresponding position, where an n-side electrode 38 will be formed on the p-side contact layer 37. Thereafter, with the use of this resist pattern as a mask, the p-side contact layer 37, the p-type cladding layer 36, the p-type guide layer 35, the active layer 34, the n-type guide layer 33 and the n-type cladding layer 32 are selectively removed in this order using a reactive-ion etching (RIE) method to expose the n-type contact layer 31.

After exposing the n-side contact layer 31, the resist pattern is removed. Then, for example, nickel (Ni), platinum (Pt) and gold (Au) are sequentially deposited on the p-side contact layer 37 to form the p-side electrode 38; and, titanium (Ti), aluminum (Al), platinum and gold are sequentially deposited on the exposed n-side contact layer 31 to form an n-side electrode 39. Thereafter, the p-side electrode 38 and the n-side electrode 39 are alloyed by means of a heat treatment. Consequently, the semiconductor laser shown in FIG. 3 is completed.

As described above, with the method of fabricating a semiconductor device according to the embodiment, the active layer 34, the n-type guide layer 33 and the p-type guide layer 35 adjacent to the active layer 34 are grown using the method of fabricating a group III-V nitride compound semiconductor of the embodiment. Thus, crystallinity of the active layer 34, the n-type guide layer 33, and the p-type guide layer 35 is improved. Accordingly, probability of occurrence of non-emission recombination, in which electrons and holes are re-bound but no emission occurs, due to crystal defects is lowered, thereby improving the emission efficiency.

Second Embodiment

A method of fabricating a group III-V nitride compound semiconductor according to a second embodiment of the present invention is the same as the first embodiment except that the group III-V nitride compound semiconductor 24 (refer to FIG. 2) is grown using a combination of the nitrogen including compound described in the first embodiment and ammonia as a nitrogen source. Here, the description is given with reference to FIGS. 1 and 2, omitting the description for the same part as the first embodiment.

When the group III-V nitride compound semiconductor layer 24 is grown using the combination of a nitrogen-including compound and ammonia as a nitrogen source, crystallinity of the group III-V nitride compound semiconductor layer 24 is improved despite the use of ammonia. The reason for this is the nitrogen-including compound, such as dimetylhydrazine, supplies nitrogen contributing the growth similar to the first embodiment and carries out the function of accelerating decomposition of ammonia by means of so-called catalysis. Therefore, ammonia is decomposed thermally and effectively by supplying the nitrogen-including compound for only a couple of percent of the amount of supplied ammonia. Nitrogen-contributing growth is effectively supplied even at a temperature below or equal to 900° C. Thus, the crystallinity of the group III-V nitride compound semiconductor layer 24 is improved.

With the method of fabricating a group III-V nitride compound semiconductor of this embodiment, similar to the first embodiment, as the growth temperature decreases, the difference between the ratio of the amount of the supplied nitrogen source to the amount of the source of the group V element supplied when only ammonia is used as a nitrogen source and the ratio of the amount of the supplied nitrogen source to the amount of the source of the group V element supplied when ammonia and the above-described nitrogen including compound are used as a nitrogen source becomes larger.

With this method of fabricating a group III-V nitride compound semiconductor of the embodiment, similar to the first embodiment, even though growth takes place at a low temperature, the ratio of the amount of the source of the group V element supplied to the amount of the source of the group III element supplied can be made smaller and crystallinity of the group III-V nitride compound semiconductor layer 24 is improved.

The method of fabricating a group III-V nitride compound semiconductor of the embodiment can be employed in the method of fabricating a semiconductor device, such as a semiconductor laser similar to the first embodiment. Specifically, for example, when the method of fabricating a group III-V nitride compound semiconductor is used at the time of growing the active layer 34, and the n-type guide layer 33 and p-type guide layer 35 adjacent to the active layer 34, the emission efficiency is improved, which is effective. Further, the buffer layer 22 is generally grown at a low temperature. So, with the use of the method of fabricating a group III-V nitride compound semiconductor of the embodiment when growing the buffer layer 22, the crystallinity improves, which is effective. It is needless to say that application of the method of fabricating a group III-V nitride compound semiconductor when growing the n-side contact layer 31, n-type cladding layer 32, the p-type cladding layer 36, the p-side contact layer 37 and the underlying layer 23 improves crystallinity, which is effective.

Although the present invention has been described above by exemplifying the embodiments, the present invention is not limited to the embodiments, and various modifications are possible. For example, in the above embodiments, hydrazine, a substitution product of hydrazine, amine and azide are examples of the nitrogen-including compound. However, the nitrogen-including compound may be replaced by other compounds having the structure including at least one of a single bond of nitrogen atoms, a double bond of nitrogen atoms and a single bond of a nitrogen atom and a carbon atom.

Although in the above embodiment a description is given using a specific example of the MOCVD apparatus, a MOCVD apparatus with other structures may be used in the present invention. For example, although with the above described embodiment the growth surface of the substrate 14 is disposed facing up inside the reaction tube 3, the growth surface of the substrate 14 may be disposed facing down. Further with the above-described embodiment, the susceptor 15 is heated by the RF coils 16, thus the substrate 14 is heated. However, the substrate may be heated with other methods, such as a heater. The reaction tube 3 may be covered with a case made of quartz glass or stainless steel.

Furthermore, although in the embodiment above the method of fabricating a semiconductor device has been described by exemplifying the specific semiconductor laser as an example of the semiconductor device, the present invention may be applied to a case where semiconductor lasers having other structures are fabricated. The present invention may be widely applied to fabrication of other semiconductor light-emitting devices, such as a light-emitting diode, and fabrication of semiconductor devices other than the semiconductor light-emitting device, such as a transistor. Namely, the present invention may be widely applied to a case where semiconductor devices including the group III-V nitride compound semiconductor layer are fabricated.

As described above, according to the first method of fabricating a group III-V nitride compound semiconductor of the invention, the nitrogen-including compound having at least one of the single bond of nitrogen atoms, the double bond of nitrogen atoms and the single bond of a nitrogen atom and a carbon atom is used as a nitrogen source. Therefore, even when the nitrogen including compound is decomposed at a temperature below or equal to 900° C., the decomposition efficiency of the nitrogen-including compound is improved compared to conventional methods. Thus, nitrogen-contributing the growth is increased, and a large amount of nitrogen is supplied onto the growth surface, thereby improving the crystallinity of the group III-V nitride compound semiconductor. According to the first method of fabricating a semiconductor device, the first method of fabricating a group III-V nitride compound semiconductor is employed, thereby improving the crystallinity of the group III-V nitride compound semiconductor layer and increasing performance of the semiconductor device.

According to the second method of fabricating a group III-V nitride compound semiconductor of the invention, in addition to ammonia, the nitrogen-including compound having at least one of the single bond of nitrogen atoms, the double bond of nitrogen atoms and the single bond of a nitrogen atom and a carbon atom is used as a nitrogen source, so that decomposition of ammonia is accelerated by means of so-called catalysis of the nitrogen-including compound, and a large amount of nitrogen contributing the growth is supplied onto the growth surface even at a temperature below or equal to 900° C. Hence, the crystallinity of the group III-V nitride compound semiconductor is improved. According to the second method of fabricating a semiconductor device of the invention, the second method of fabricating a group III-V nitride compound semiconductor is employed, thereby improving the crystallinity of the group III-V nitride compound semiconductor layer and increasing performance of the semiconductor device.

According to the third method of fabricating a group III-V nitride compound semiconductor of the invention, the nitrogen-including compound having at least one of the single bond of nitrogen atoms, the double bond of nitrogen atoms and the single bond of a nitrogen atom and a carbon atom is used as a nitrogen source. Therefore, the decomposition efficiency of a nitrogen source is improved compared to conventional methods. When the group III-V nitride compound semiconductor including indium is grown, the crystallinity is improved. According to the third method of fabricating a semiconductor device of the invention, the third method of fabricating a group III-V nitride compound semiconductor is employed, thereby improving the crystallinity of the group III-V nitride compound semiconductor layer and increasing performance of the semiconductor device.

According to the fourth method of fabricating a group III-V nitride compound semiconductor of the invention, as a nitrogen source in addition to ammonia, the nitrogen-including compound having at least one of the single bond of nitrogen atoms, the double bond of nitrogen atoms and the single bond of a nitrogen atom and a carbon atom is used, so that decomposition of ammonia is accelerated by means of so-called catalysis of the nitrogen-including compound. When the group III-V nitride compound semiconductor including indium is grown, the crystallinity is improved. According to the fourth method of fabricating a semiconductor device of the invention, the fourth method of fabricating a group III-V nitride compound semiconductor is employed, thereby improving the crystallinity of the group III-V nitride compound semiconductor layer and increasing performance of the semiconductor device.

Obviously, many modifications and variations of the present invention are possible in the light of the above teachings. It is, therefore, understood that within the scope of the appended claims, the invention may be practiced otherwise than as specifically described.

What is claimed is:

1. A method of fabricating a group III-V nitride compound semiconductor in which a group III-V nitride compound semiconductor including at least one selected from group III elements and at least nitrogen (N) selected from group V elements is grown using a metal organic chemical vapor deposition method, wherein a first growth temperature is below or equal to 900° C.;

a nitrogen-including compound having at least one of a single bond of nitrogen atoms, a double bond of nitrogen atoms and a single bond of a nitrogen atom and a carbon atom is used as the nitrogen source;

at least an active layer is grown by the nitrogen-including compound; and an n-type cladding layer is grown at a second growth temperature greater than 900° C. whereby the nitrogen source is ammonia.

2. A method of fabricating a group III-V nitride compound semiconductor according to claim 1, wherein a gas including hydrazine or a substitution product of hydrazine is used as the nitrogen including compound.

3. A method of fabricating a group III-V nitride compound semiconductor according to claim 1, wherein a gas including amine is used as the nitrogen including compound.

4. A method of fabricating a group III-V nitride compound semiconductor according to claim 1, wherein a gas including azide is used as the nitrogen including compound.

5. A method of fabricating a group III-V nitride compound semiconductor according to claim 1, wherein the group III elements include indium (In).

6. A method of fabricating a group III-V nitride compound semiconductor according to claim 1, wherein at least a guiding layer and the active layer are grown whereby the nitrogen-including compound is the nitrogen source.

7. A method of fabricating a group III-V nitride compound semiconductor according to claim 1, wherein the active layer is grown at a temperature less than approximately 900 C.

* * * * *